(12) United States Patent
Nakatsuka

(10) Patent No.: US 9,305,972 B2
(45) Date of Patent: Apr. 5, 2016

(54) MAGNETIC RANDOM ACCESS MEMORY AND METHOD OF MANUFACTURING THE SAME

(71) Applicant: Keisuke Nakatsuka, Kobe (JP)

(72) Inventor: Keisuke Nakatsuka, Kobe (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/200,838

(22) Filed: Mar. 7, 2014

(65) Prior Publication Data

US 2015/0129945 A1 May 14, 2015

Related U.S. Application Data

(60) Provisional application No. 61/903,252, filed on Nov. 12, 2013.

(51) Int. Cl.
*H01L 27/22* (2006.01)
*H01L 43/12* (2006.01)

(52) U.S. Cl.
CPC .............. *H01L 27/228* (2013.01); *H01L 43/12* (2013.01)

(58) Field of Classification Search
CPC ..................................................... H01L 27/228
USPC ................................... 257/349, 519; 365/158
See application file for complete search history.

(56) References Cited

U.S. PATENT DOCUMENTS

2011/0233661 A1   9/2011   Kajiyama
2014/0319590 A1*  10/2014  Nakatsuka ..................... 257/295

FOREIGN PATENT DOCUMENTS

JP    2013-105841 A    5/2013
JP    2013-105890 A    5/2013

* cited by examiner

*Primary Examiner* — Mark Prenty
(74) *Attorney, Agent, or Firm* — Holtz, Holtz & Volek PC

(57) ABSTRACT

According to one embodiment, a memory includes a semiconductor layer including a trench which extends in a first direction, the trench having a first portion with a first depth and a second portion with a second depth deeper than the first depth, a gate insulating layer covering the semiconductor layer in the first portion, an element isolation layer covering the semiconductor layer in the second portion, the element isolation layer extending in a second direction from the second portion, a gate electrode provided on the gate insulating layer in the first portion and the element isolation layer in the second portion, the gate electrode filling the trench, and a third impurity region provided in the semiconductor layer directly below the second portion, the third impurity region being continuous in the first direction.

15 Claims, 16 Drawing Sheets

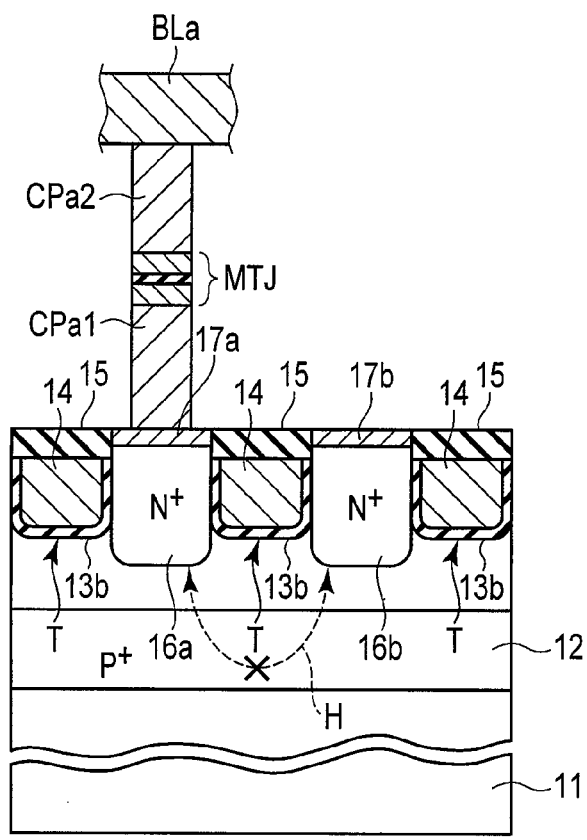
F I G. 2
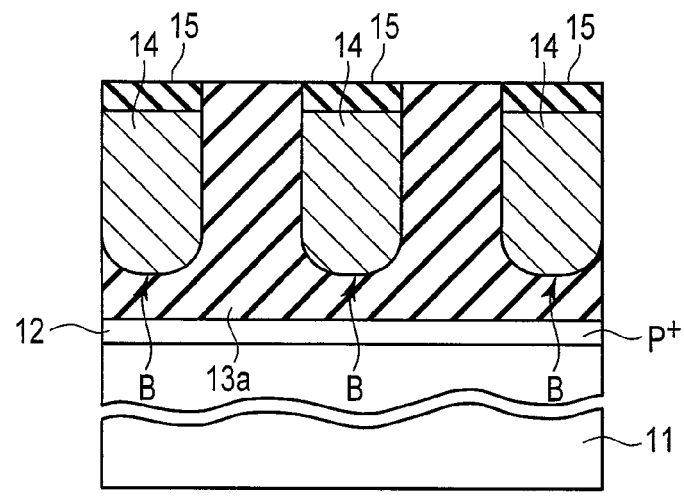
F I G. 3

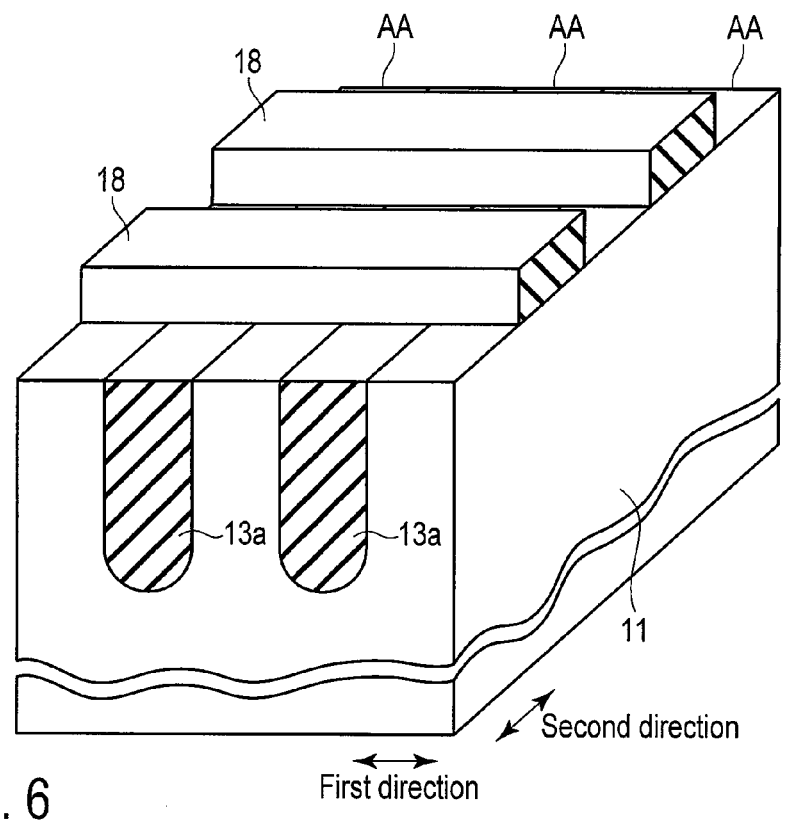
F I G. 6
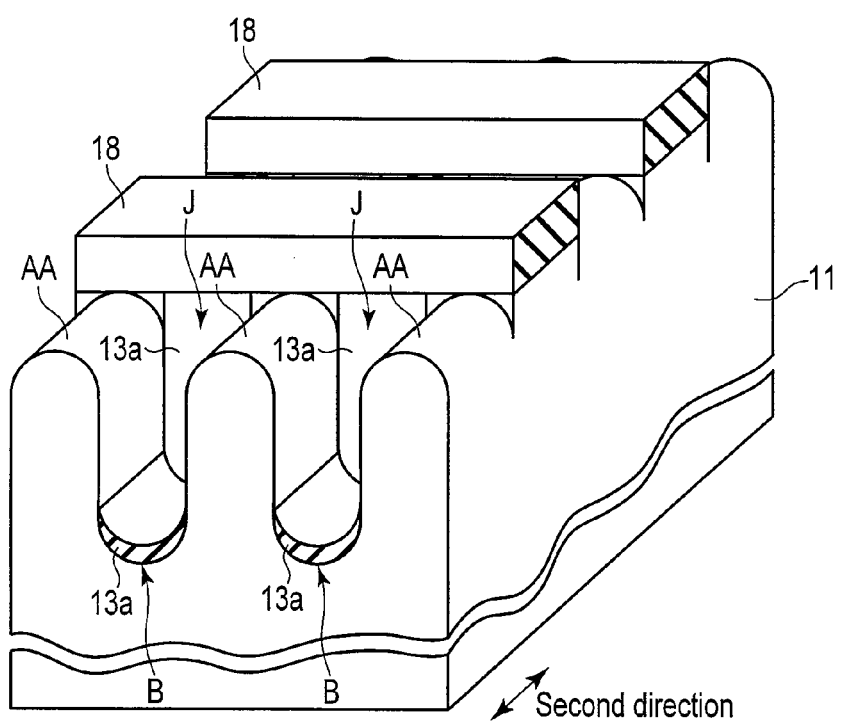
F I G. 7

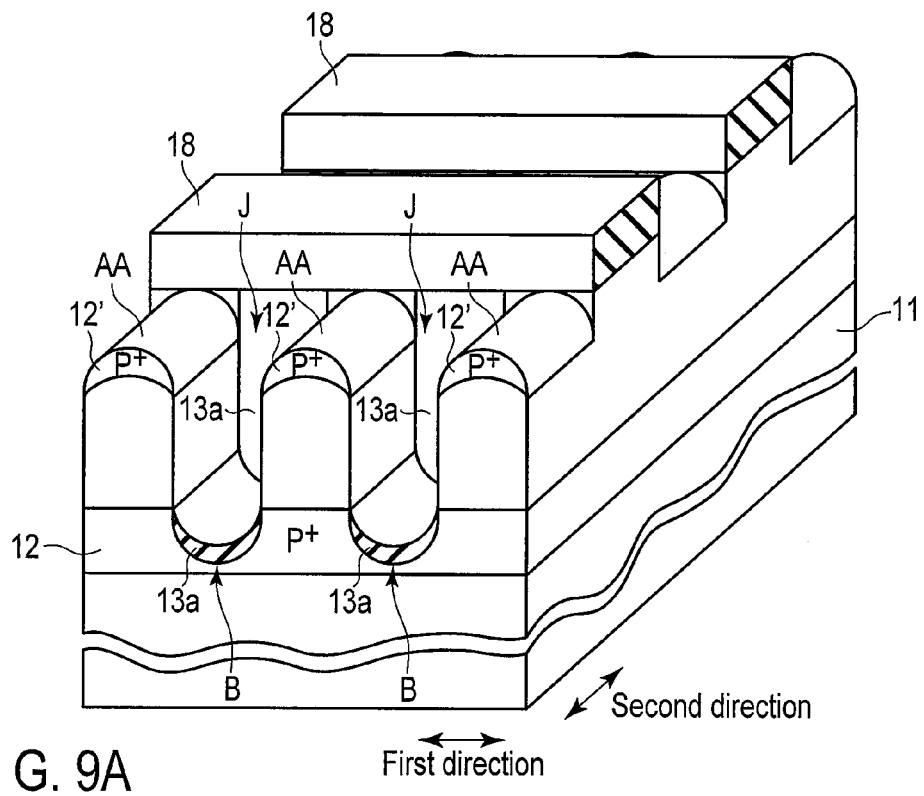
F I G. 9A
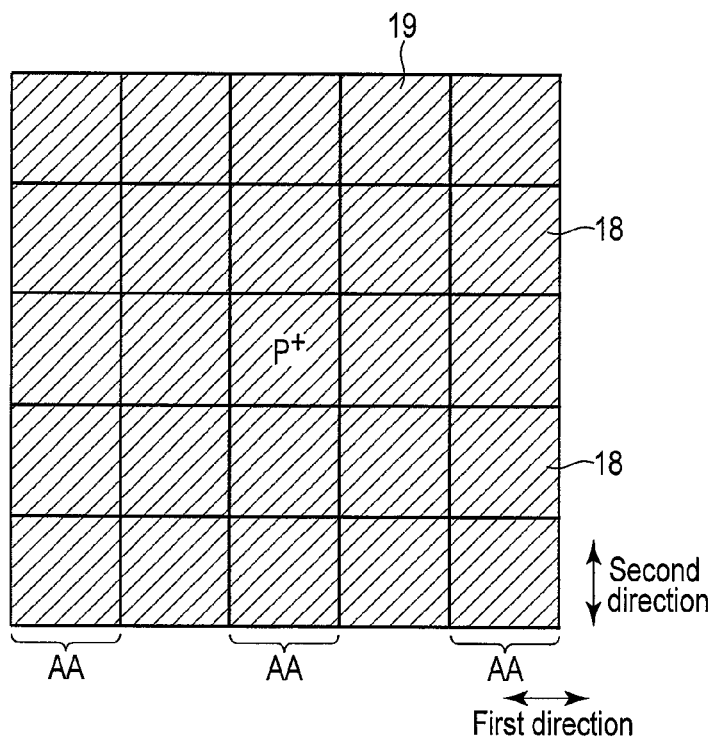
F I G. 9B

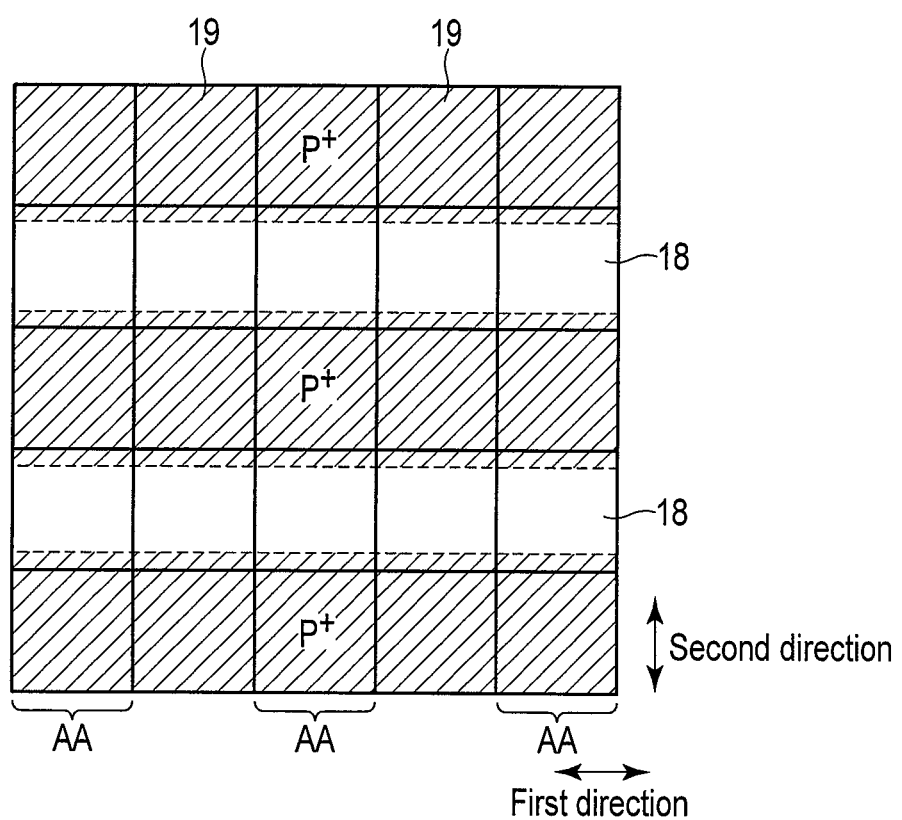
F I G. 9C

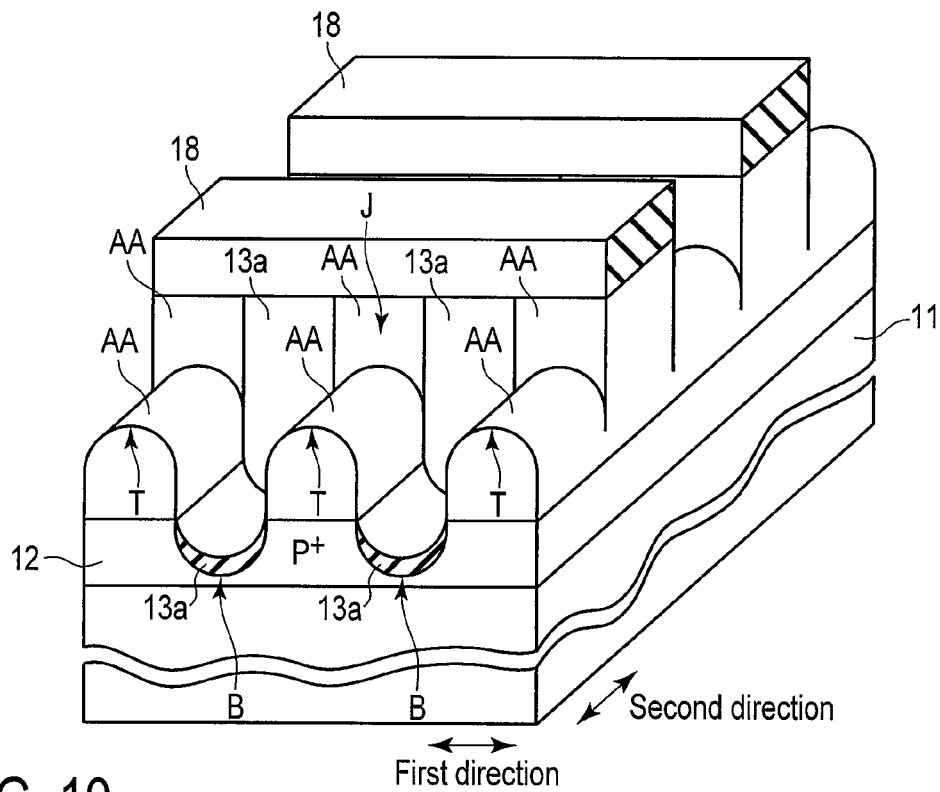
F I G. 10
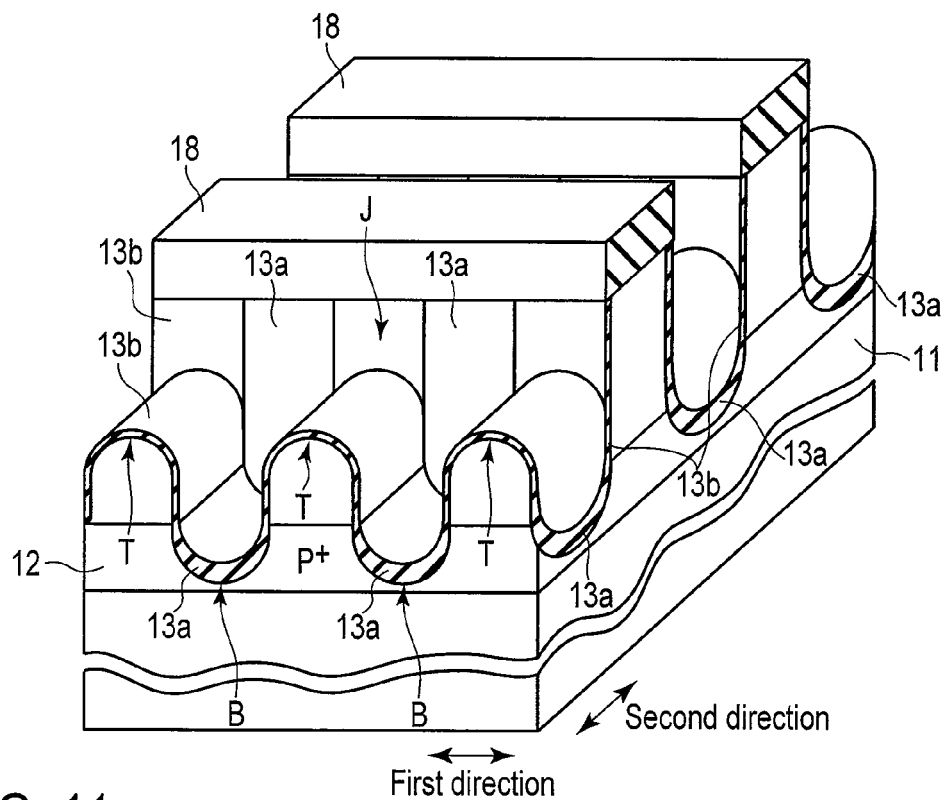
F I G. 11

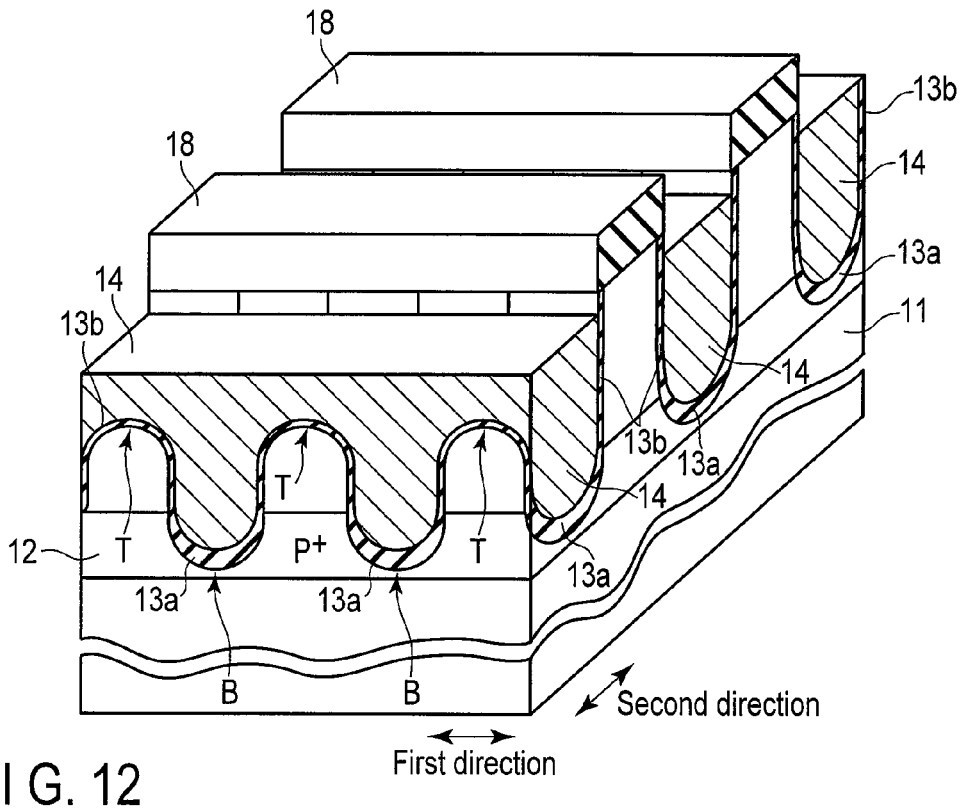
F I G. 12
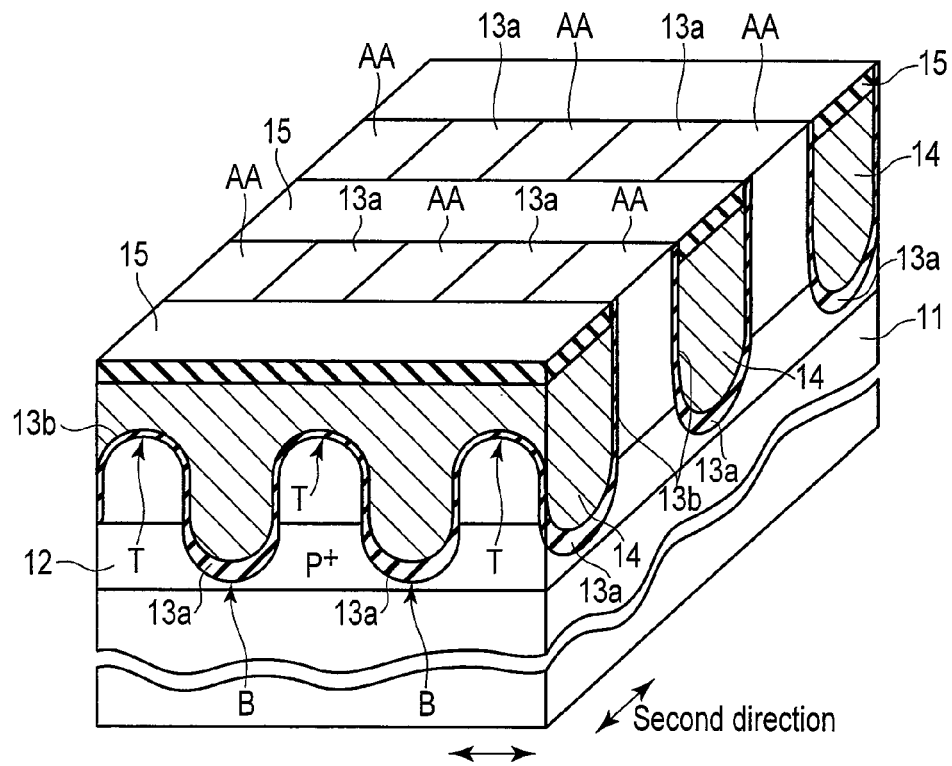
F I G. 13

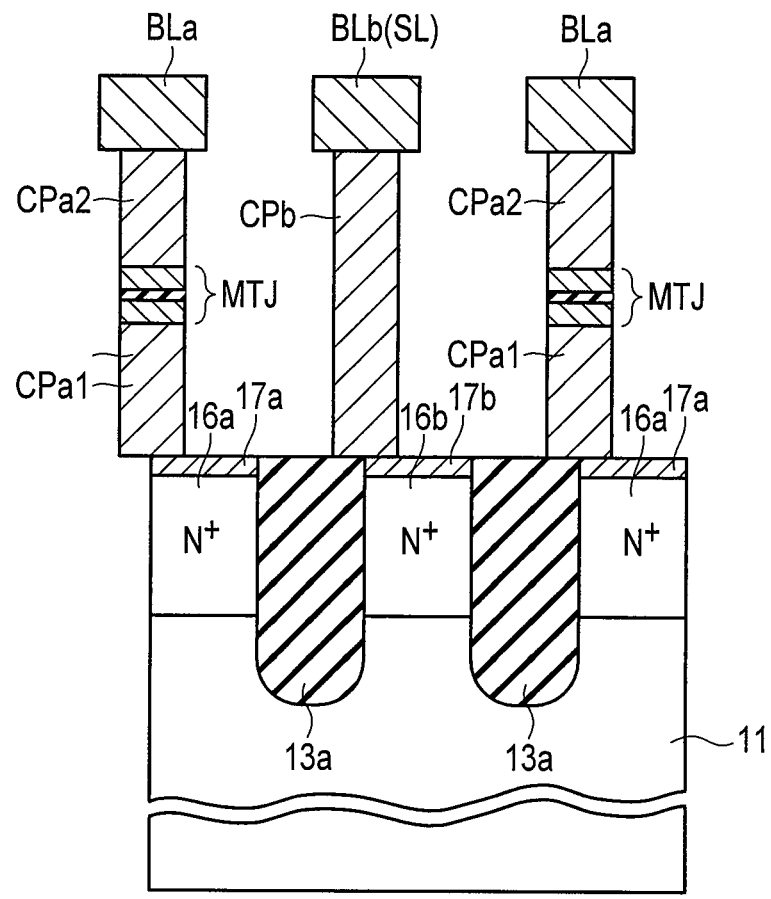
F I G. 21

MAGNETIC RANDOM ACCESS MEMORY AND METHOD OF MANUFACTURING THE SAME

CROSS-REFERENCE TO RELATED APPLICATIONS

This application claims the benefit of U.S. Provisional Application No. 61/903,252, filed Nov. 12, 2013, the entire contents of which are incorporated herein by reference.

FIELD

Embodiments described herein relate generally to a magnetic random access memory and a method of manufacturing the same.

BACKGROUND

Various new next-generation memories have recently been proposed as alternatives to existing semiconductor memories, such as flash memories and DRAMs. Among them, magnetic random access memories (hereinafter, "MRAMs"), which can exhibit high-speed operation and can be micro-fabricated, are leading candidates as replacements for the DRAMs. MRAM memory elements are magnetoresistive effect elements. Each magnetoresistive effect element has, as a basic structure, a laminated structure comprising a reference layer of constant magnetization, a memory layer of variable magnetization, and a tunnel barrier layer interposed therebetween.

BRIEF DESCRIPTION OF THE DRAWINGS

FIG. 2 is a cross-sectional view taken along line II-II of FIG. 1B;

FIG. 3 is a cross-sectional view taken along line of FIG. 1B;

FIGS. 6, 7 and 8A are perspective views showing a method of manufacturing the memory cell array shown in FIGS. 1A, 1B and 2 to 4;

FIG. 9A is a perspective view showing a method of manufacturing the memory cell array shown in FIGS. 1A, 1B and 2 to 4;

FIGS. 9B and 9C are plan views showing a channel stopper obtained after thermal diffusion;

FIGS. 10 to 16 are perspective views showing a method of manufacturing the memory cell array shown in FIGS. 1A, 1B and 2 to 4;

FIG. 21 is a cross-sectional view taken along line XXI-XXI of FIG. 20.

DETAILED DESCRIPTION

In general, according to one embodiment, a magnetic random access memory comprises: a semiconductor layer with a first conductivity type including a trench which extends in a first direction, the trench having a first portion with a first depth and a second portion with a second depth deeper than the first depth; a gate insulating layer covering the semiconductor layer in the first portion; an element isolation layer covering the semiconductor layer in the second portion, the element isolation layer extending in a second direction from the second portion, the second direction in parallel with the upper surface of the semiconductor layer, the first and second directions which intersect with one another; a gate electrode provided on the gate insulating layer in the first portion and the element isolation layer in the second portion, the gate electrode filling the trench; first and second impurity regions with a second conductivity type provided in the semiconductor layer, the first and second impurity regions sandwiching the gate electrode; a magnetoresistive element connected to the first impurity region; a first bit line connected to the magnetoresistive element; a second bit line connected to the second impurity region; and a third impurity region with the first conductivity type provided in the semiconductor layer directly below the second portion, the third impurity region being continuous in the first direction, the third impurity region having an impurity concentration higher than an impurity concentration of the semiconductor layer.

Embodiment

Referring to the accompanying drawings, an embodiment will be described.

Figure 1A:
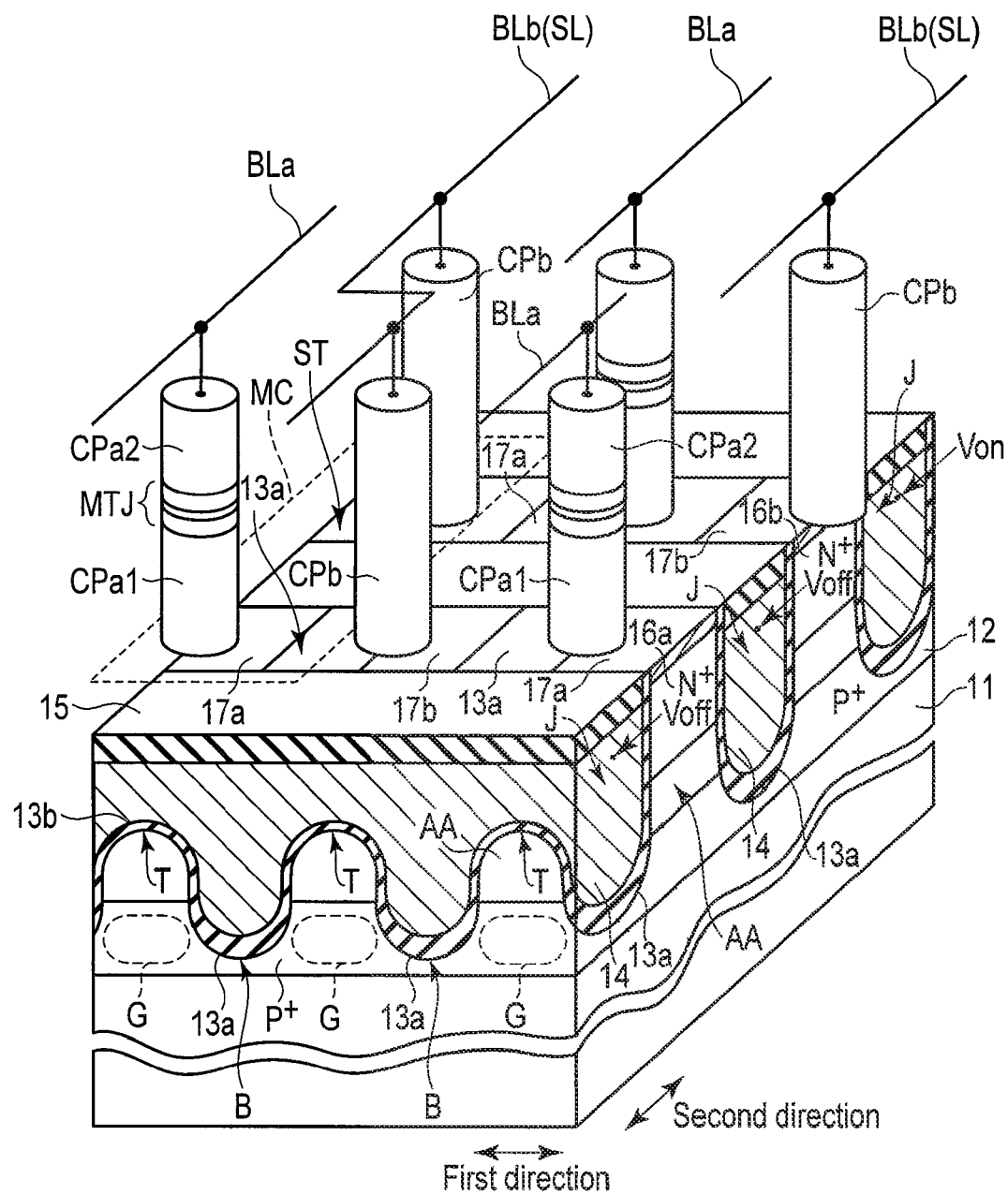
FIG. 1A is a perspective view of an example of an MRAM memory cell array.
Figure 1B:
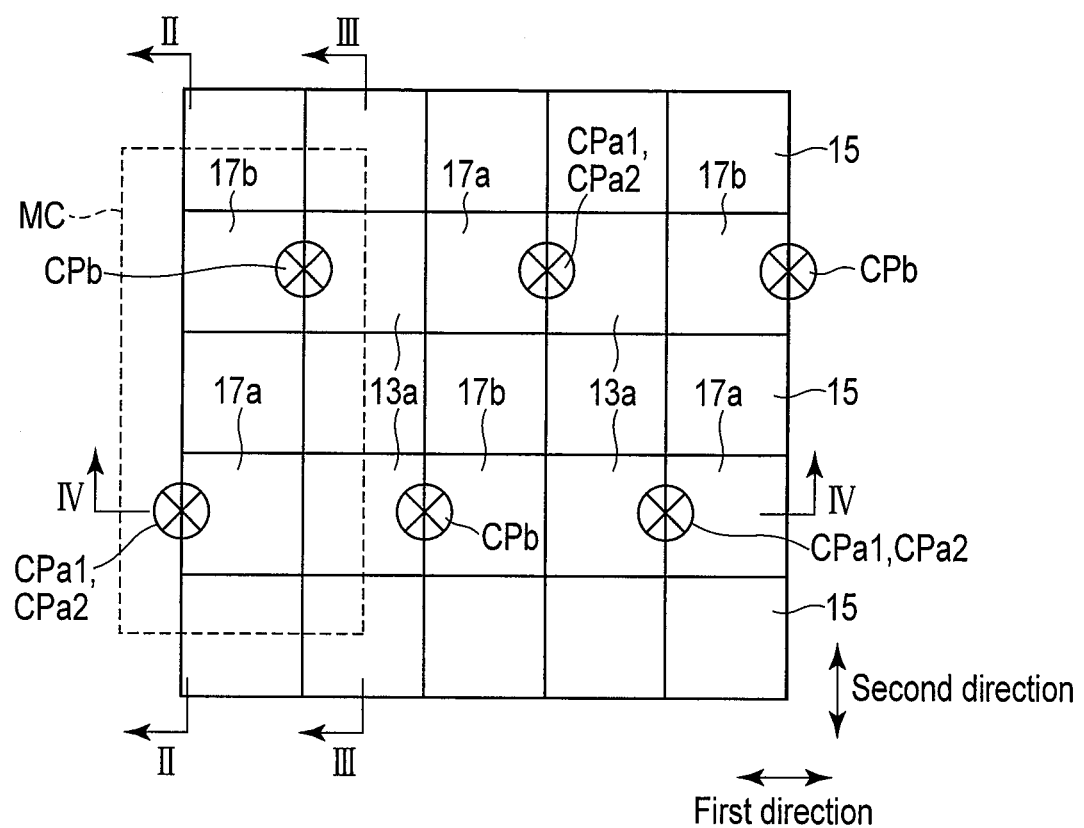
FIG. 1B is a cross-sectional view of an example of the MRAM memory cell array.
Figure 4:
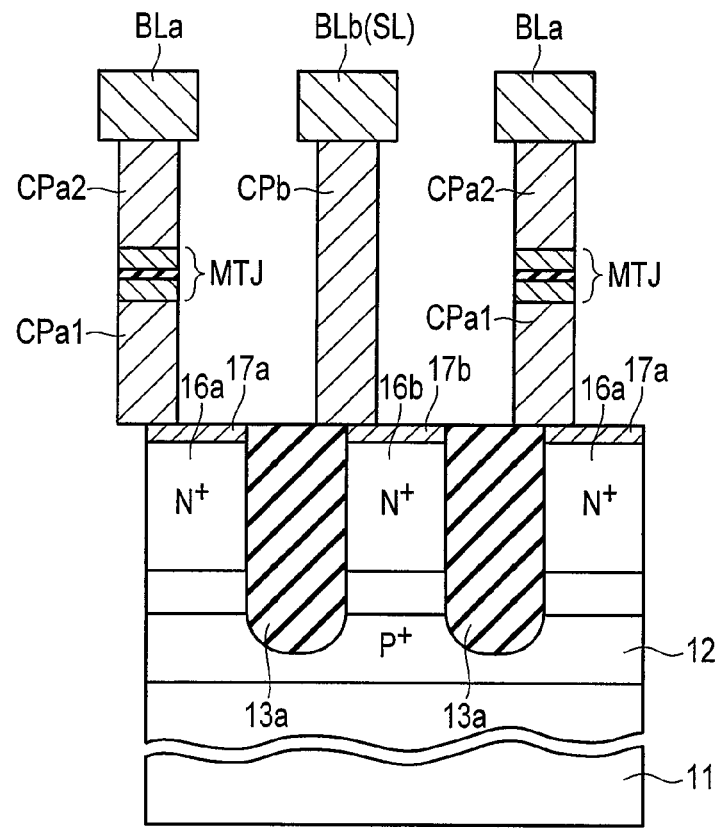
FIG. 4 is a cross-sectional view taken along line IV-IV of FIG. 1B.
Figure 5:
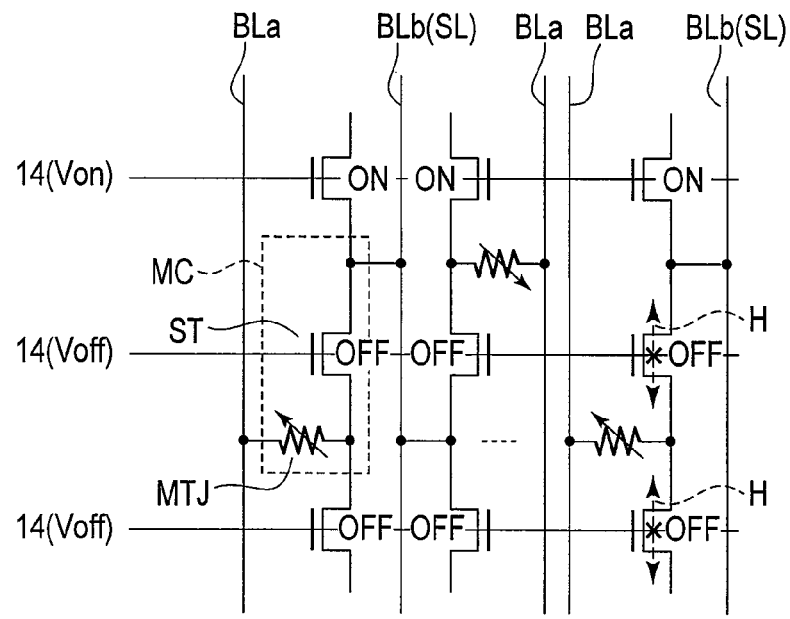
FIG. 5 shows an equivalent circuit to the memory cell array shown in FIGS. 1A, 1B and 2 to 4.

FIGS. 1A, 1B and 2 to 4 shows the device structure of an MRAM memory cell array. FIG. 1B is a plan view of the device structure of FIG. 1A. FIG. 2 is a cross-sectional view taken along line II-II of FIG. 1B. FIG. 3 is a cross-sectional view taken along line III-III of FIG. 1B. FIG. 4 is a cross-sectional view taken along line IV-IV of FIG. 1B. FIG. 5 shows an equivalent circuit to the memory cell array shown in FIGS. 1A, 1B and 2 to 4.

As shown in FIGS. 1A, 1B and 2 to 5, each memory cell MC comprises a single selection transistor (cell transistor) ST and a single magnetoresistive effect element MTJ.

A semiconductor layer (e.g., a semiconductor substrate) 11 is of a first-conductivity type (e.g., p-type). Trenches J are each formed in the semiconductor layer 11 such that they extend in a first direction parallel to the upper surface of the semiconductor layer 11. Further, each trench J includes first portions T having a first depth and second portions B having a second depth greater than the first depth. As shown in FIG. 1A, the first portions T of each trench J have, for example, convex curved surfaces, and the second portions B of each trench J have, for example, concave curved surfaces.

FIG. 2 shows a cross section of the trenches J of FIG. 1A including the first portions T, and FIG. 3 shows a cross section of the trenches J of FIG. 1A including the second portions B.

In each trench J, the first portions T and the second portions B are alternately arranged, and the semiconductor layer 11 serves as fin-type active areas AA in the first portions T. The active areas AA extend in a second direction intersecting the first direction. The upper surfaces of the active areas AA in the first portions T are at a lower level than the upper surfaces of the active areas AA in the portions other than the first portions T. The upper and side surfaces of the active areas AA in the first portions T serve as channels.

Gate insulating layers 13b cover the portions of the semiconductor layer 11 exposed to the first portions T of the trenches J. Further, element isolation layers 13a are formed on the bottoms of the second portions B of the trenches J, and extend in the second direction from the bottoms of the second portions B. The upper surfaces of the element isolation layers 13a in the second portions B are at a lower level than those of the element isolation layers 13a in the portions other than the second portions B.

The element isolation layers 13a and the gate insulating layers 13b comprise, for example, oxide silicon layers.

Gate electrodes 14 serving as a word line WL are provided on the gate insulating layers 13b of the first portions T and on the element isolation layers 13a in the second portions B, thereby filling the trenches J. The gate electrodes 14 each comprise, for example, a metal layer, a conductive polysilicon layer, etc.

The upper surfaces of the gate electrodes 14 are at a lower level than those of first and second impurity regions 16a and 16b as source and drain regions. The lower surfaces of the gate electrodes 14 in the second portions B are at a higher level than the lower surfaces of the element isolation layers 13a.

Insulating layers 15 cover the upper surfaces of gate electrodes 14. The insulating layers 15 comprise, for example, silicon nitride layers.

The first and second impurity regions 16a and 16b are of a second conductivity type (e.g., n type) opposite to the first conductivity type. The first and second impurity regions 16a and 16b are adjacent to the first portions T of the trenches J in the second direction such that they sandwich the corresponding first portions T. The first and second impurity regions 16a and 16b have a depth greater than the first portions T of the trenches J and less than the second portions B.

Metal silicide layers 17a and 17b are provided on the first and second impurity regions 16a and 16b.

A third impurity region 12 has a conductivity type opposite to the conductivity type of the first and second impurity regions 16a and 16b, i.e., has the first conductivity type (e.g., p type). The third impurity region 12 is provided in the semiconductor layer 11 including portions thereof located just below the element isolation layers 13a, and has a higher impurity concentration than the semiconductor layer 11.

In order to enhance the function as a channel stopper, the third impurity region 12 is formed like, for example, a plate so as to cover the entire memory cell array. However, the third impurity region 12 may be formed in part of the semiconductor layer 11. For instance, the third impurity region 12 may be formed to a line & space pattern extending in the first direction.

Further, the third impurity region 12 is in contact with the bottoms of the element isolation layers 13a. This prevents off leak (the leak currents flowing between the first and second impurity regions 16a and 16b and indicated by the arrow in FIG. 2) H in the semiconductor layer 11, more specifically, in regions G shown in FIG. 1A, as will be described later.

In order to enhance the function of preventing the off leak H, it is desirable that the impurity concentration of the third impurity region 12 should be ten times or more that of the semiconductor layer 11.

First and second bit lines BLa and BLb extend in the second direction. The second bit lines BLb also function as source lines SL during data reading.

The magnetoresistive effect elements MTJ are provided on the metal silicide layers 17a on the first impurity regions (drains) 16a via contact plugs CPa1. Further, the first bit lines BLa are provided on the magnetoresistive effect elements MTJ via contact plugs CPa2. The second bit lines (source lines SL) BLb are provided via contact plugs CPb on the metal silicide layers 17b on the second impurity regions (sources) 16b.

The contact plugs CPa1 and CPa2 are slightly displaced in the first direction relative to the metal silicide layers 17a on the first impurity regions 16a. Similarly, the contact plugs CPb are slightly displaced in the first direction relative to the metal silicide layers 17b on the second impurity regions 16b.

Each magnetoresistive effect element MTJ comprises, for example, a storing layer of variable vertical magnetization, a reference layer of constant vertical magnetization, and a tunnel barrier layer therebetween.

In the above-described structure, in an MRAM memory cell array comprising embedded-gate type and saddle-fin type cell transistors, the third impurity region (channel stopper layer) 12 having a higher impurity concentration than the semiconductor layer, which is of a conductivity type opposite to that of the source/drain of the cell transistor and serves as an active area AA, is provided in a region including the region just below the element isolation layers 13a.

Therefore, even if the depth of the source/drain of all cell transistors is increased to reduce the ON resistance of a selected cell transistor, occurrence of off leak (leak path) H between the source and drain of non-selected cell transistors can be prevented.

This will be explained using the device of FIG. 1 and its equivalent circuit shown in FIG. 5.

As shown in FIG. 5, in saddle-fin type cell transistors, an ON potential (e.g., a positive potential) Von is applied to the gate electrode 14 of a selected cell transistor, and an OFF potential (e.g., a ground potential) Voff is applied to the gate electrode 14 of a non-selected cell transistor.

In the selected cell transistor (denoted by ON in FIG. 5), a channel is formed in the active area AA in the first portion T in the trench J, and hence a read or write current flows into the selected cell transistor. In contrast, in the non-selected cell transistor (denoted by OFF in FIG. 5), no channel is formed in the active area AA in the first portion T in the trench J, and hence no read or write current flows into the non-selected cell transistor.

In the non-selected cell transistor, since a thick element isolation layers 13a is formed in the second portion B in the trench J, the potential applied to the gate electrode 14 cannot sufficiently control channel forming in the second portion B in the trench J. Accordingly, off leak H will easily occur between the source/drain of the non-selected cell transistor.

However, in the embodiment, the off leak H occurring between the source/drain of the non-selected cell transistor can be avoided by providing the third impurity region 12 as mentioned above.

Referring then to FIGS. 6 to 16, a description will be given of a method of manufacturing the above-described memory cell array.

Firstly, as shown in FIG. 6, element isolation layers (e.g., silicon oxide layers) 13a of a line & space pattern extending in the second direction is formed in the semiconductor layer 11.

The element isolation layers 13a have a shallow trench isolation (STI) structure, and are formed by the combination of, for example, a photo engraving process (PEP), chemical vapor deposition (CVD) and chemical mechanical polishing (CMP).

Thereafter, mask layers (e.g., silicon nitride layers) 18 of a line & space pattern extending in the first direction are formed on the semiconductor layer 11.

After that, using the mask layers 18 as masks, the element isolation layers 13a are selectively etched by, for example, reactive ion etching (RIE), as is shown in FIG. 7. Since this etching is performed under the conditions that enable the element isolation layers 13a to be more easily etched than the semiconductor layer 11, there is a case where part of the semiconductor layer 11 may be etched as shown in FIG. 7. For instance, the upper surface of the semiconductor layer (active area) 11 may be formed into convex surface portions.

In addition, as a result of this etching, the element isolation layers 13a only remain on the bottoms (second portions B) of trenches TR in the regions covered with no mask layers 18.

Figure 8A:
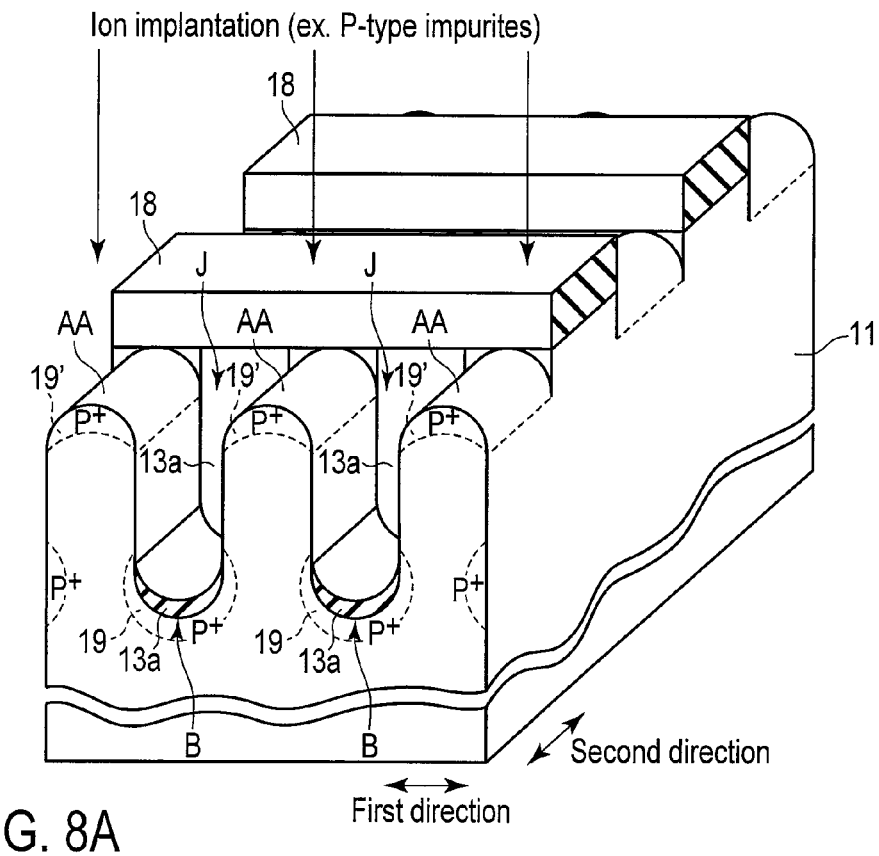

Subsequently, as shown in FIG. 8A, an impurity of the first conductivity (e.g., p type), such as boron, is implanted in the semiconductor layer 11 by, for example, ion implantation using the mask layers 18 as masks. As a result, third impurity regions 19 are formed in the semiconductor layer 11 just below the element isolation layers 13a, and third impurity regions 19' are formed in the upper surface regions of the semiconductor layer 11 serving as active areas AA.

At this time, it is desirable that the first-directional width of the third impurity region 19 in the semiconductor layer 11 just below the element isolation layer 13a be slightly greater than the first-directional width of the second portion B in the trench J. Similarly, it is desirable that the second-directional width of the third impurity region 19 be slightly greater than the second-directional width of the trench J (i.e., the width between two mask layers 18). For instance, if the first-directional width of the second portion B of the trench J and the second-directional width of the trench J (i.e., the width between two mask layers 18) are both 20 nm, it is desirable that the third impurity region 19 have a width of approx. 25 nm in the first and second directions.

Figure 8B:
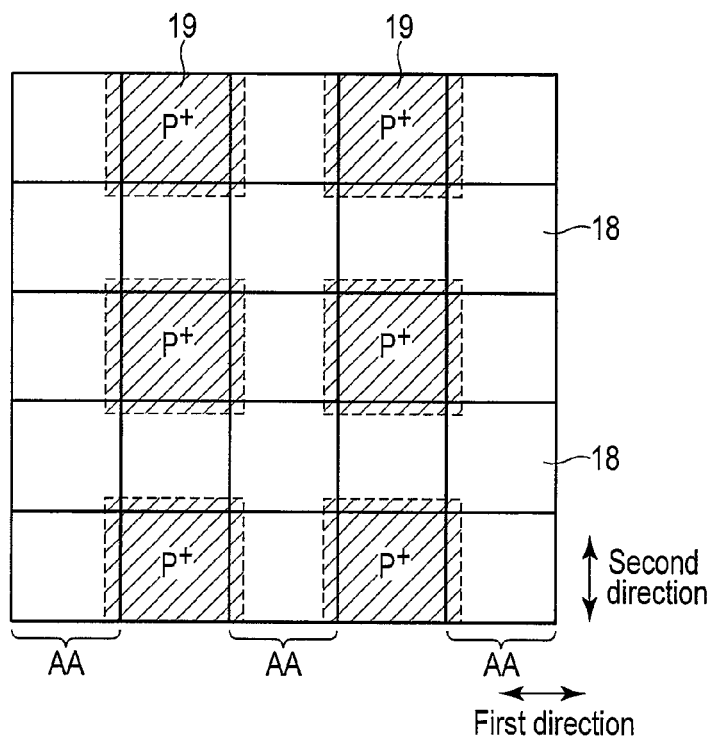
FIG. 8B is a plan view of a channel stopper obtained before thermal diffusion.

FIG. 8B is a plan view of the structure shown in FIG. 8A. As shown in FIG. 8B, the third impurity regions 19 (indicated by hatching) in the semiconductor layer 11 just below the element isolation layer 13a are separate from each other but arranged regularly in a matrix. Note that in FIG. 8B, the third impurity regions 19', which are formed in the upper surface regions of the semiconductor layer 11 serving as active areas AA, are omitted in order to enable the positions of the third impurity regions 19 in the semiconductor layer 11 just below the element isolation layer 13a to be easily understood.

Thereafter, by, for example, thermal diffusion, the impurity ions in the third impurity regions 19 and 19' in the semiconductor layer 11 are diffused. As a result, as shown in FIGS. 9A and 9B, the third impurity regions 19 in the semiconductor layer 11 just below the element isolation layer 13a are spread in the first and second directions, whereby they are changed into a plate-like third impurity region 12 that covers the entire memory cell array. In FIG. 9B, the third impurity regions 19 in the semiconductor layer 11 just below the element isolation layer 13a are indicated by hatching.

The third impurity regions 19 in the semiconductor layer 11 just below the element isolation layer 13a may not always be shaped like a plate. For example, the third impurity regions 19 in the semiconductor layer 11 just below the element isolation layer 13a may have a line & space pattern extending in the first direction, as is shown in FIG. 9C.

Namely, the third impurity regions 19 in the semiconductor layer 11 just below the element isolation layers 13a may be continuous in the first direction and non-continuous in the second direction.

Further, as a result of the thermal diffusion, the third impurity regions 19' (see FIG. 8A), which are formed in the upper surface regions of the semiconductor layer 11 serving as active areas AA, also change into activated third impurity regions 12', as is shown in FIG. 9A. The third impurity regions 12' may degrade the reliability of the gate insulating layer of the cell transistor formed later.

To avoid this, as shown in FIG. 10, the semiconductor layer 11 is selectively etched by, for example, RIE using the mask layers 18 as masks. As a result, the third impurity regions 12' (see FIG. 9) formed as the active areas AA in the upper surface regions of the semiconductor layer 11 are removed.

As a result of elimination by the etching, the first portions T in the trenches J shallower than the second portions B become upper surface portions of the semiconductor layer 11. Further, as shown in the figure, the first portions T in the trenches J may become convex portions.

Subsequently, as shown in FIG. 11, gate insulating layers 13b which cover the semiconductor layer 11 exposed in the first portions T are formed by, for example, thermal oxidation. The gate insulating layers 13b are coupled to the element isolation layers 13a existing in the second portions B in the trenches J.

After that, as shown in FIG. 12, gate electrodes 14 are formed on the gate insulating layers 13b of the first portions T and on the element isolation layers 13a of the second portions B by, for example, sputtering, thereby filling the trenches J. Thereafter, the upper surfaces of the gate electrodes 14 are flattened by, for example, CMP.

It is desirable that the upper surfaces of gate electrodes 14 be at a level lower than the upper surface portions of the semiconductor layer 11 covered with the mask layers 18.

After that, the mask layers 18 are removed.

Subsequently, as shown in FIG. 13, insulating layers (e.g., silicon nitride layers) 15 are formed on the gate electrodes 14, the active areas AA and the element isolation layers 13a by, for example, CVD. The insulating layers 15 are left only on the gate electrodes 14 by polishing the layers 15 by, for example, CMP.

Figure 14:
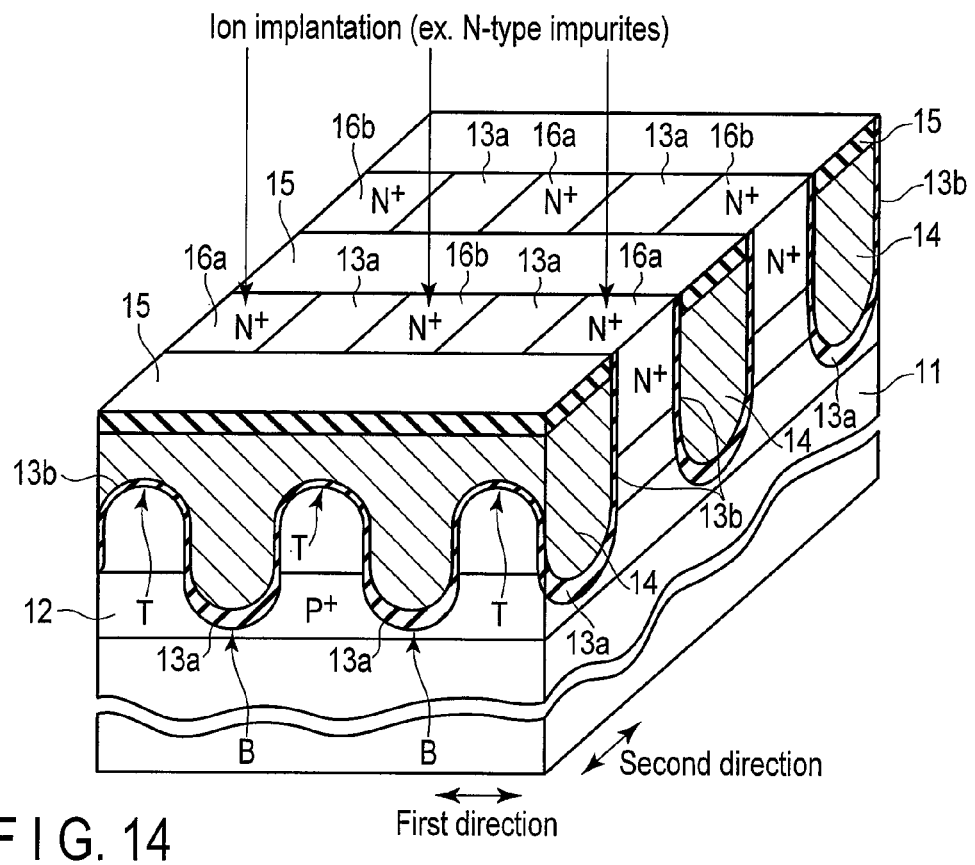

Thereafter, as shown in FIG. 14, an impurity of the second conductivity type (e.g., n type), such as phosphorous, is implanted into the semiconductor layer 11 by ion implantation using the gate electrodes 14 as masks. As a result, the first and second impurity regions (source/drain) 16a and 16b are formed. The depth of the first and second impurity regions 16a and 16b is set greater than the first portion T of the trench J, and less than the second portion B of the trench J.

Figure 15:
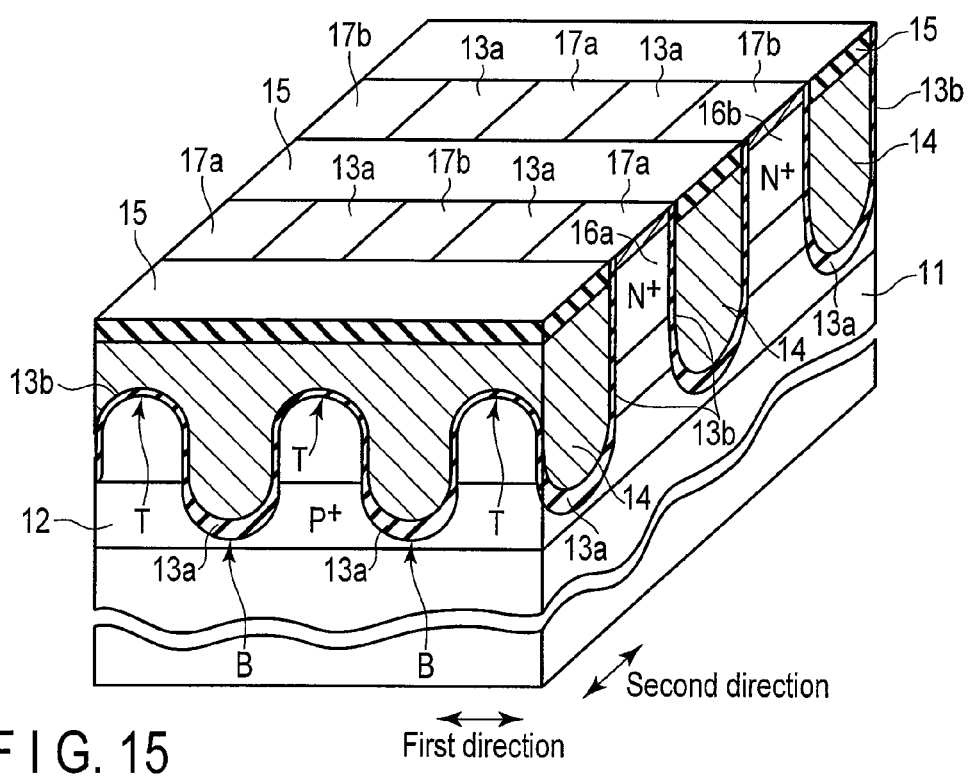

As shown in FIG. 15, metal silicide layers 17a and 17b are formed on the first and second impurity regions 16a and 16b, respectively, to reduce the contact resistances thereof.

Figure 16:
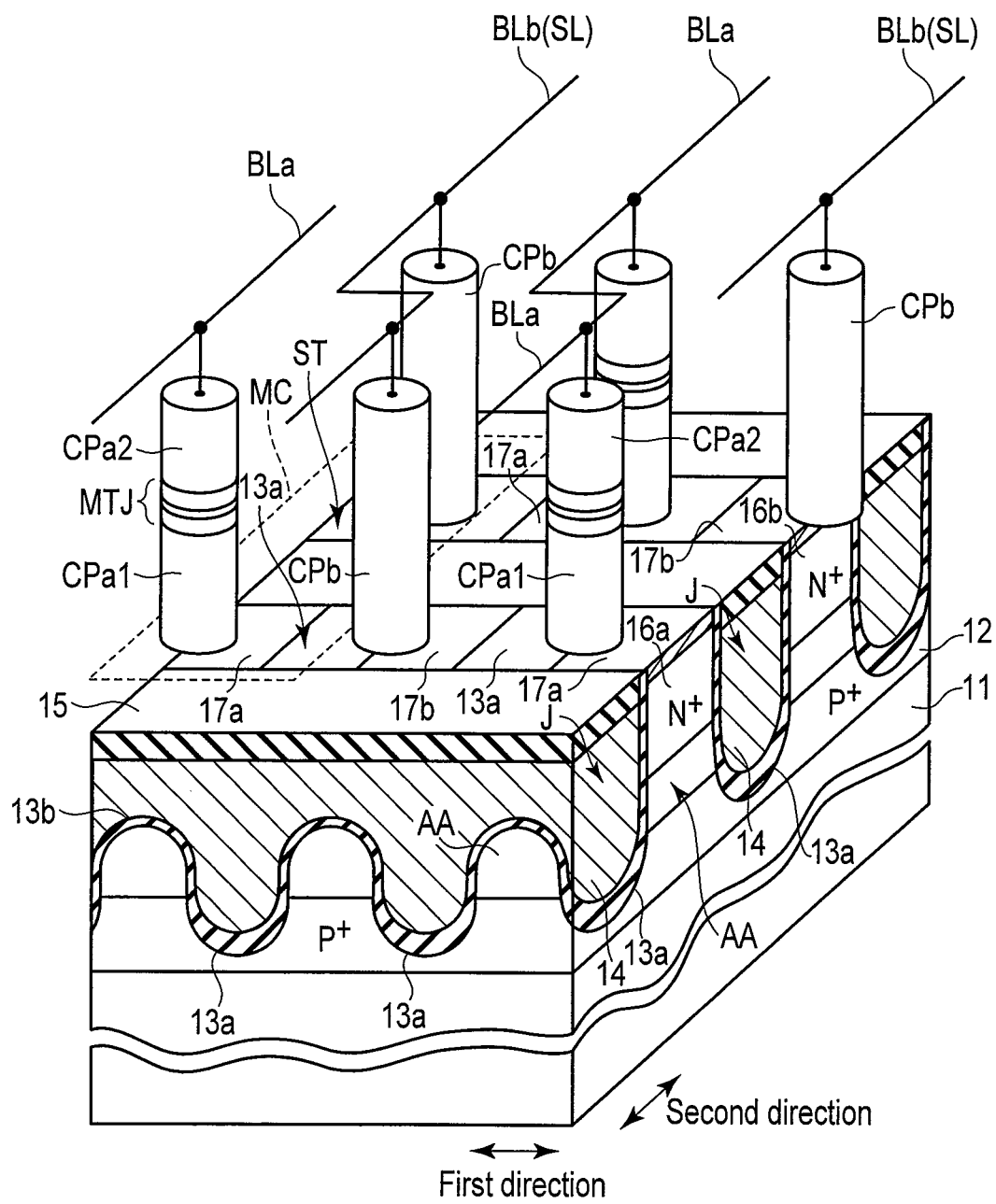

Lastly, as shown in FIG. 16, magnetoresistive effect elements MTJ are formed on the metal silicide layers 17a on the first impurity regions 16a via contact plugs CPa1. Further, first bit lines BLa are provided on the magnetoresistive effect elements MTJ via contact plugs CPa2. Second bit lines (source lines SL) BLb are provided via contact plugs CPb on the metal silicide layers 17b on the second impurity regions (sources) 16b.

Similarly, second bit lines (source lines SL) BLb are provided via contact plugs CPb on the metal silicide layers 17b on the second impurity regions 16b.

By the above manufacturing method, the structure shown in FIGS. 1 to 5 is completed.

In the manufacturing method, the third impurity regions 19' formed in the step of FIG. 8A are removed by the etching step shown in FIG. 10 after the thermal diffusion (activation of the impurity ions) shown in FIGS. 9A, 9B and 9C.

Alternatively, the third impurity regions 19' formed in the step of FIG. 8A may be removed by the etching step of FIG. 10 before the thermal diffusion (activation of the impurity ions) shown in FIGS. 9A, 9B and 9C.

In this case, the distance between the first portion T and the second portion B in the trench J shown in FIG. 10 can be increased, i.e., the length of each of the active areas (fins) AA in the direction perpendicular to the first and second directions can be increased. This is because the impurity diffuses by thermal diffusion. Namely, as a result of thermal diffusion, the bottom of the third impurity region 12' shown in FIG. 9A is located at a level lower than the bottom of the third impurity region 19' shown in FIG. 8A. Accordingly, the length of each active area (fin) AA can be increased when the third impurity region 19' shown in FIG. 8A is removed, compared to the case where the third impurity region 12' shown in FIG. 9A is removed.

As is evident from the above, if the third impurity region 19' formed in the step shown in FIG. 8A is removed by the etching step shown in FIG. 10 before the thermal diffusion (activation of the impurity) shown in FIGS. 9A, 9B and 9C, the channel width (proportional to the fin height) of the cell transistor can be increased, with the result that the cell transistor characteristics can be enhanced.

Comparative Example

In the above-described embodiment, off leak in the magnetic random access memory is prevented by removing unnecessary impurity region portions on the active areas after the third impurity region as a channel stopper layer is formed.

FIGS. 17 to 21 show a method of manufacturing a comparative example.

Figure 17:
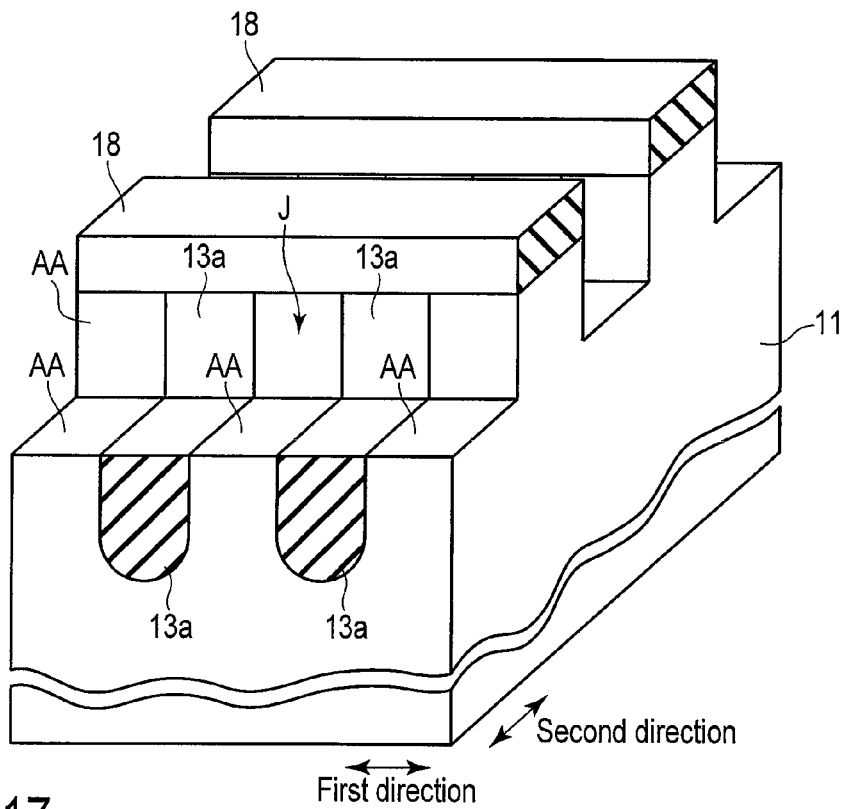
FIGS. 17 to 20 are perspective views showing a manufacturing method as a comparative example.

Firstly, as shown in FIG. 17, the steps up to the forming of the mask layers 18 are similar to those described above. After that, the semiconductor layer 11 and the element isolation layers 13a are etched by, for example, RIE, using the mask layers 18 as masks.

Figure 18:
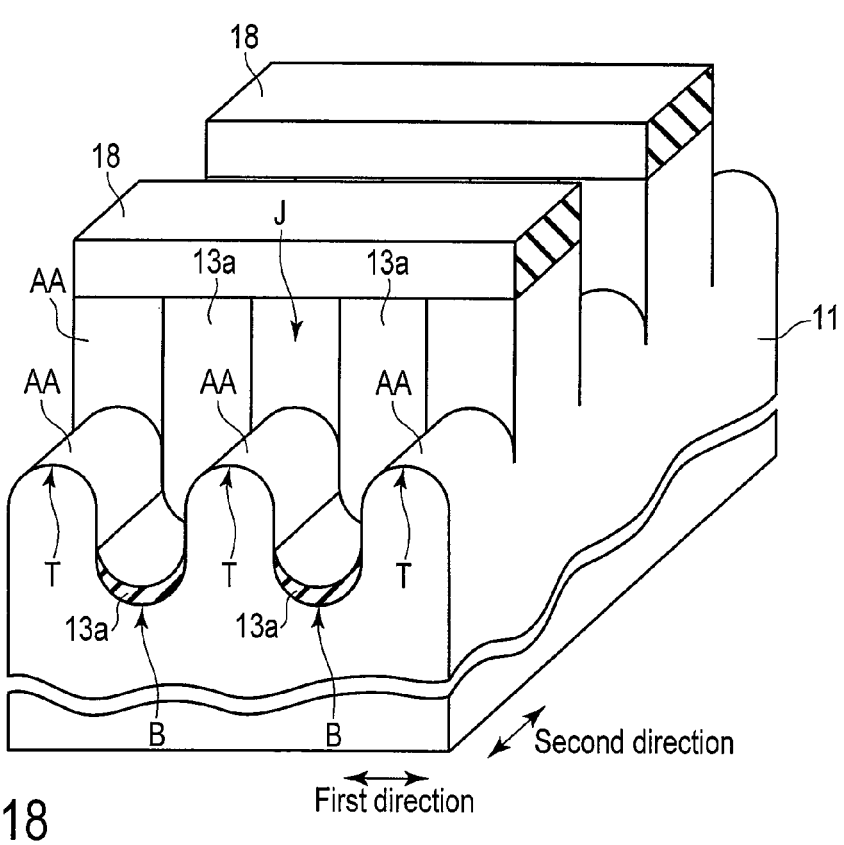

Subsequently, as shown in FIG. 18, the element isolation layers 13a are selectively etched by, for example, RIE, using the mask layers 18 as masks.

As a result, in the portions covered with no mask layers 18, the element isolation layers 13a are left in the bottom portions (i.e., the second portions B) of the trenches J. In this etching, since the upper surface of the semiconductor layer (active area) 11 is slightly etched, it may be formed into convex surface portions as shown in the figure.

Figure 19:
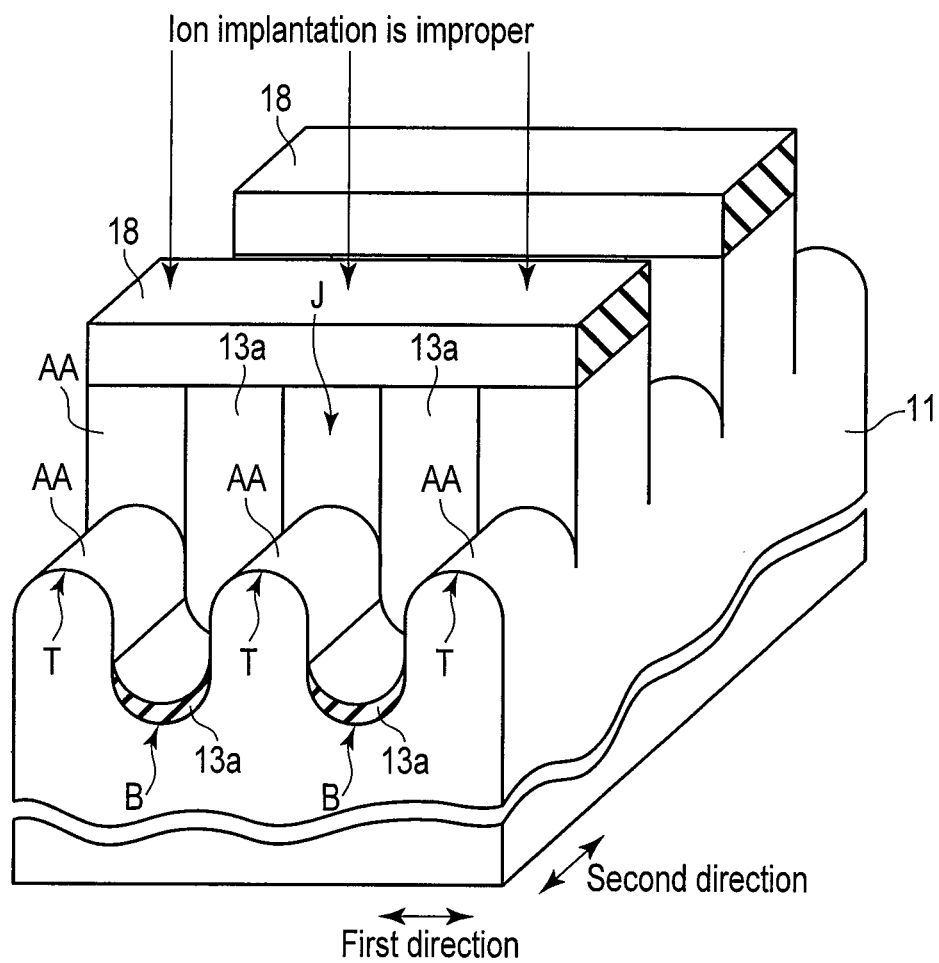

The etching of the semiconductor layer 11 and the element isolation layers 13a shown in FIG. 17, and the selective etching of the element isolation layers 13a shown in FIG. 18, are necessary for forming saddle-fin type cell transistors. In this case, however, the third impurity regions (channel stopper layers) cannot be formed by ion implantation as shown in FIG. 19.

This is because when ion implantation is performed at this time, if an unintentional third impurity region is formed in the active area AA, it cannot be removed by etching since the distance between the first portion T and the second portion B in each trench J is short (i.e., the fin height is low). Namely, to secure the fin height, the unintentional third impurity region cannot be removed, whereas to forcedly remove the third impurity region, the fin height will become extremely low or the fin itself (active area) will disappear.

Because of the above, in the comparative example, the third impurity region as a channel stopper layer cannot be formed, whereby off leak cannot be prevented.

Figure 20:
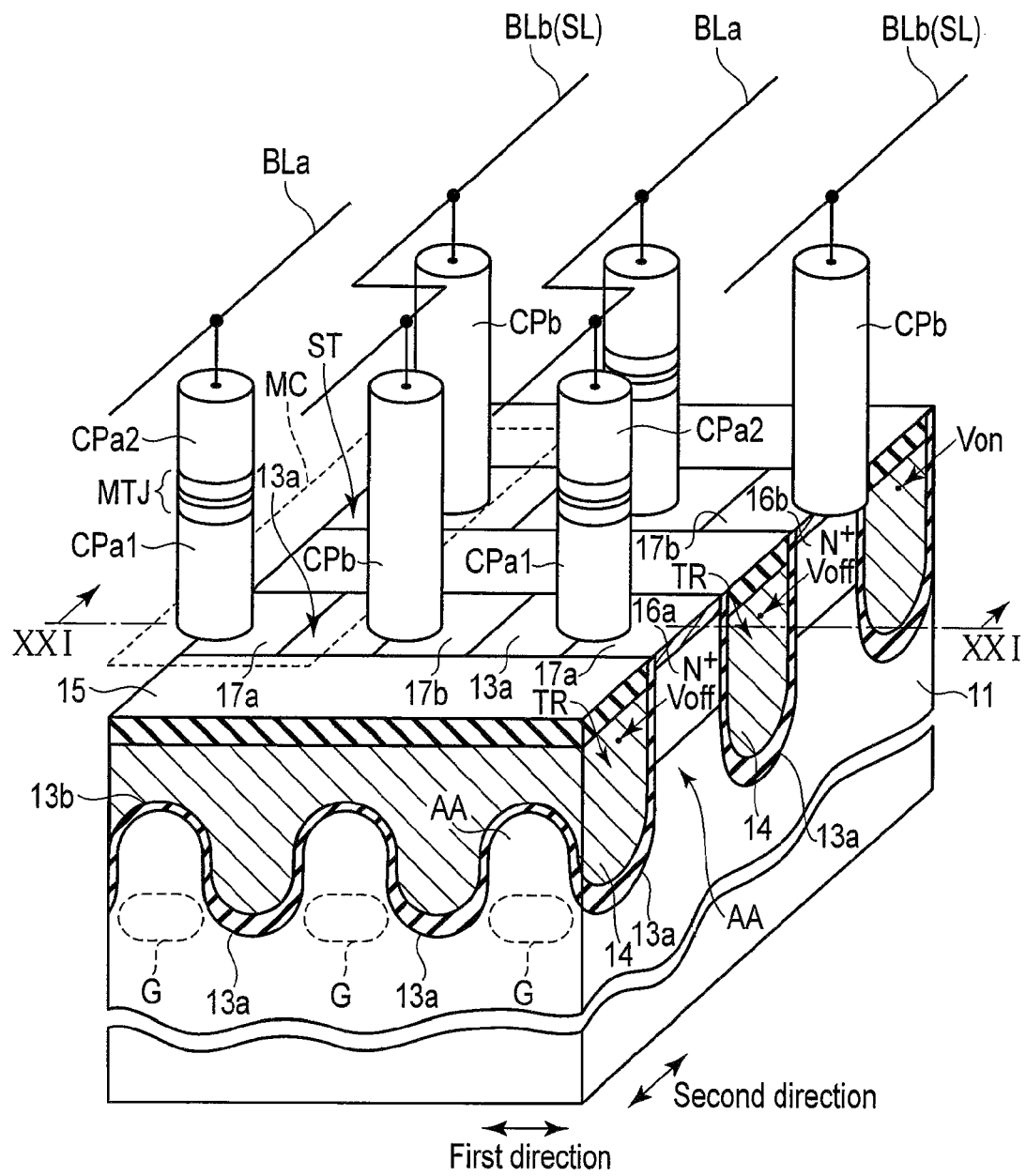

For instance, as is evident from FIGS. 20 and 21, in non-selected cell transistors having gate electrodes 14 to which the off potential Voff is applied, in the portions of the semiconductor layer 11 adjacent to the element isolation layers 13a in the second portions B of the trenches J, in particular, in regions G, off leak (leak paths) H will occur (see FIG. 2). Namely, the gate electrodes 14 in the second portions B in the trenches J cause the portions of the semiconductor layer 11 just below the element isolation layers 13a to be inverted in conductivity type, thereby causing the leak paths H (see FIG. 2).

In the above-mentioned comparative example, when nothing is formed in the semiconductor layer 11, i.e., before the element isolation layers 13a shown in FIG. 17 are formed, ion implantation for forming the third impurity region as the channel stopper layer can be performed.

However, if the element isolation layers 13a are formed after the third impurity regions are formed in the semiconductor layer 11, the third impurity region and the second portion B of each trench J cannot be self-aligned. In other words, variation will occur in the positional relationship between the third impurity region and the second portion B of each trench J, which results in variation in off leak characteristics.

In contrast, in the embodiment, when the fin as the active area AA is sufficiently high, ion implantation for forming the third impurity regions (channel stopper layers) 19 is performed on the second portion B of each trench J, as is shown in FIG. 8A.

Consequently, the third impurity region 12 after thermal diffusion can be self-aligned with the second portion B of each trench J. Namely, since the positional alignment between the third impurity region 12 and the second portion B of each trench J can be performed accurately, variation will not occur in off leak characteristics.

Further, even if etching is performed to remove unnecessary third impurity regions 12' shown in FIG. 9A, a sufficient distance can be secured, even after the etching, between the first portion T and the second portion B of each trench J as shown in FIG. 10, since the fins as the active areas AA are originally sufficiently high.

CONCLUSION

As described above, in the magnetic random access memory of the embodiment, since ON resistance of a selected cell transistor is set low, off leak between the source and drain of each non-selected cell transistor can be effectively prevented even when the source/drain depth of all transistors is set deep.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising:
   a semiconductor layer with a first conductivity type including a trench which extends in a first direction, the trench having a first portion with a first depth and a second portion with a second depth deeper than the first depth;
   a gate insulating layer covering the semiconductor layer in the first portion;
   an element isolation layer covering the semiconductor layer in the second portion, the element isolation layer extending in a second direction from the second portion, wherein the second direction is in parallel with an upper surface of the semiconductor layer, and the first and second directions intersect with one another;

a gate electrode provided on the gate insulating layer in the first portion and the element isolation layer in the second portion, the gate electrode filling the trench;

first and second impurity regions with a second conductivity type provided in the semiconductor layer, the first and second impurity regions sandwiching the gate electrode;

a magnetoresistive element connected to the first impurity region;

a first bit line connected to the magnetoresistive element;

a second bit line connected to the second impurity region; and a third impurity region with the first conductivity type provided in the semiconductor layer directly below the second portion, wherein the third impurity region is continuous in the first direction, and the third impurity region has an impurity concentration higher than an impurity concentration of the semiconductor layer.

2. The memory of claim 1, wherein the third impurity region is adjacent to the element isolation layer of the second portion.

3. The memory of claim 1, wherein the third impurity region has a line & space pattern extending in the first direction.

4. The memory of claim 1, wherein the third impurity region has a plate pattern covering a memory cell array region.

5. The memory of claim 1, wherein the third impurity region contacts with a bottom of the element isolation layer.

6. The memory of claim 1, wherein the impurity concentration of the third impurity region is ten times or more than the impurity concentration of the semiconductor layer.

7. The memory of claim 1, wherein:

the element isolation layer comprises a first upper surface in the second portion, and a second upper surface in a portion other than the second portion; and the first upper surface of the element isolation layer is lower than the second upper surface of the element isolation layer.

8. The memory of claim 1, wherein the first and second impurity regions have a depth greater than the first portion and less than the second portion.

9. The memory of claim 1, wherein the semiconductor layer serves as an active area under the first portion.

10. The memory of claim 9, wherein the active area extends in the second direction, and an upper surface of the active area in the first portion is lower than an upper surface of the active area in a portion other than the first portion.

11. The memory of claim 9, wherein an upper surface and a side surface of the active area function as a channel.

12. The memory of claim 1, wherein an upper surface of the gate electrode is lower than upper surfaces of the first and second impurity regions.

13. The memory of claim 1, wherein an upper surface of the gate electrode is covered with an insulating layer different from the gate insulating layer and the element isolation layer.

14. The memory of claim 1, further comprising a metal silicide layer provided on the first and second impurity regions.

15. The memory of claim 1, wherein the magnetoresistive element comprises a storage layer, a reference layer, and a tunnel barrier layer interposed therebetween.

* * * * *